US006741844B2

(12) United States Patent
Medvid et al.

(10) Patent No.: US 6,741,844 B2
(45) Date of Patent: May 25, 2004

(54) RECEIVER FOR AUDIO ENHANCEMENT AND METHOD THEREFOR

(75) Inventors: Joseph J. Medvid, Weston, FL (US); Dang N. Vu, Parkland, FL (US); Branko Avanic, Miami, FL (US)

(73) Assignee: Motorola, Inc., Schaumburg, IL (US)

( * ) Notice: Subject to any disclaimer, the term of this patent is extended or adjusted under 35 U.S.C. 154(b) by 80 days.

(21) Appl. No.: 09/995,084

(22) Filed: Nov. 27, 2001

(65) Prior Publication Data

US 2003/0100279 A1 May 29, 2003

(51) Int. Cl.[7] .................................................. H04Q 7/20
(52) U.S. Cl. ................. 455/232.1; 455/234.1; 455/234.2
(58) Field of Search .......................... 455/164.1, 164.2, 455/232.1, 234.1, 234.2, 240.1, 296, 138, 184.1, 213, 219, 220, 226.1, 226.2, 226.3, 229; 375/317, 320, 327, 345, 346, 350, 343

(56) References Cited

U.S. PATENT DOCUMENTS

| 3,976,943 | A | * | 8/1976 | Cipher et al. ................ 455/144 |
| 4,510,624 | A | * | 4/1985 | Thompson et al. .......... 455/223 |
| 5,001,776 | A | * | 3/1991 | Clark ........................ 455/226.2 |
| 5,511,235 | A | * | 4/1996 | Duong et al. ................. 455/75 |
| 5,742,899 | A | * | 4/1998 | Blackburn et al. ........ 455/234.2 |
| 5,805,979 | A | * | 9/1998 | Miyashita ................... 340/7.43 |
| 5,917,315 | A | * | 6/1999 | Weckstrom .............. 324/76.23 |
| 6,035,008 | A | * | 3/2000 | Kim ............................ 375/345 |
| 6,178,211 | B1 | | 1/2001 | Whikehart et al. |
| 6,370,370 | B1 | * | 4/2002 | Roth et al. ................... 455/307 |

* cited by examiner

Primary Examiner—Jean Gelin
(74) Attorney, Agent, or Firm—Randi L. Dulaney (57) ABSTRACT

A receiver (10) includes an antenna (12), a preselector (14), an amplifier (16), a mixer (18), a filter (20), a signal strength measurement circuit (22), a radio frequency signal detector (26), and a processor (24). The processor (24) is programmed to receive a signal indicator level (42) from the signal strength measurement circuit (22), generate an automatic gain control command (44) based on the received signal indicator level (42), and send the automatic gain control command (44) to the amplifier (16) to control a gain of the amplifier (16). The processor (24) is programmed to receive an off channel signal strength (48) from the radio frequency signal detector (26), compare the off channel signal strength (48) to one or more threshold levels, generate a filter command (46), and send the filter command (46) to the filter (20). The filter command (46) identifies a cutoff frequency for the filter (20).

19 Claims, 5 Drawing Sheets

—PRIOR ART—

RECEIVER FOR AUDIO ENHANCEMENT AND METHOD THEREFOR

BACKGROUND OF THE INVENTION

1. Field of the Invention

This invention relates in general to radio receivers and in particular to radio receivers with audio enhancing capabilities.

2. Description of the Related Art

Recent requirements by the Federal Communications Commission (FCC) have mandated communication device suppliers to design receivers for use in communication devices with highly restrictive channel bandwidths (i.e. 12.5 KHz, 6.25 KHz). This restriction on the bandwidth of a signal inherently degrades the audio performance of the communication device. The degradation can be attributed to the narrower intermediate frequency (IF) bandwidths necessary to obtain adjacent channel and other receiver performance properties.

For a given set of specifications there is a maximum intermediate frequency bandwidth that can be used on the receiver to satisfy these specifications. Detrimentally, as the channel spacing decreases (i.e. 12.5 KHz, 6.25 KHz), the intermediate frequency bandwidths needed for operating within the associated radio frequency (RF) characteristics of the communication link begin to attenuate the high frequency audio components of the received signal. Audio signal clarity and intelligibility has been shown to be highly correlated to the high frequency content of the signal. This attenuation of the high frequency components results in perceived degradation in the crispness and punch through of the demodulated audio signal. The communication device performance, while benefiting from having higher channels for a given spectrum, is compromised by the degradation on the intelligibility of the recovered audio.

Figure 1:
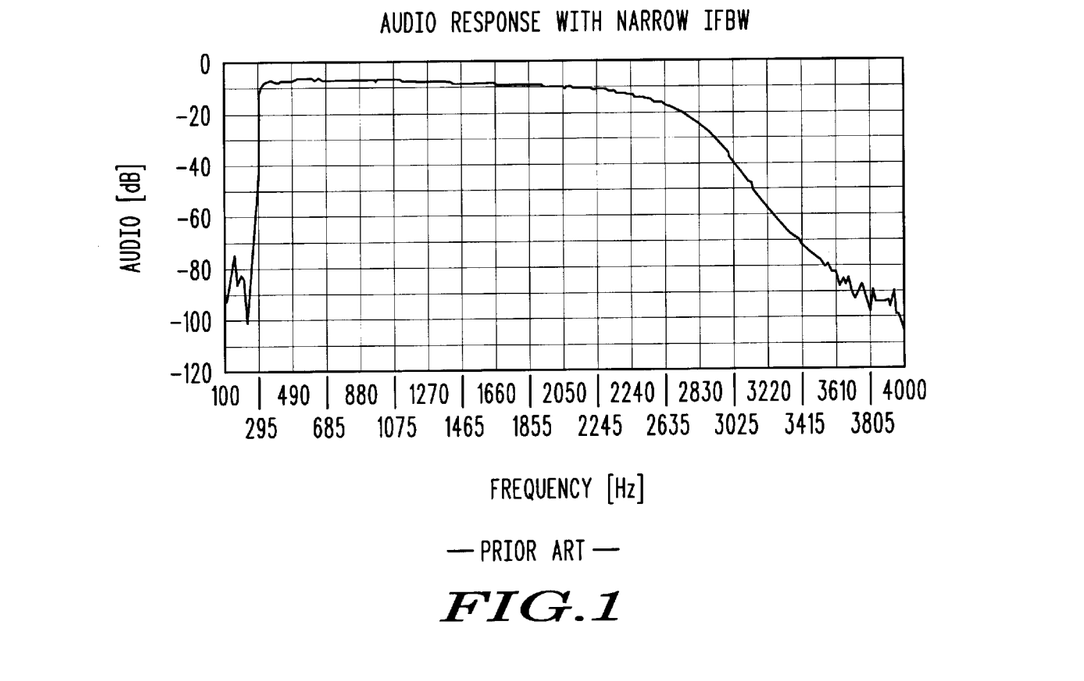
FIGS. 1 to 3 illustrate various embodiments of the recovered audio spectrum of a receiver.

In conventional designs, the intermediate frequency bandwidth (IFBW) of a receiver is primarily determined by the channel spacing of the receiver combined with the specifications the receiver is designed to meet (i.e. adjacent channel, sensitivity, etc). As channel spacing is reduced, the intermediate frequency bandwidth must be reduced in order to maintain the same RF specifications of the receiver. Eventually a point is reached where the IFBW is too small and the demodulated receive audio suffers in intelligibility and crispness. FIG. 1 illustrates the recovered audio spectrum of a typical receiver with the IFBW set for a typical narrow channel spacing system. As illustrated, the components on the higher end of the audio spectrum (2.5 Khz–3.5 KHz) are considerably attenuated.

Therefore, what is needed is a means for providing superior audio performance while maintaining radio frequency performance.

BRIEF DESCRIPTION OF THE DRAWINGS

The present invention will be described by way of exemplary embodiments, but not limitations, illustrated in the accompanying drawings in which like references denote similar elements, and in which.

DETAILED DESCRIPTION OF THE PREFERRED EMBODIMENT(S)

As required, detailed embodiments of the present invention are disclosed herein; however, it is to be understood that the disclosed embodiments are merely exemplary of the invention, which may be embodied in various forms. Therefore, specific structural and functional details disclosed herein are not to be interpreted as limiting, but merely as a basis for the claims and as a representative basis for teaching one skilled in the art to variously employ the present invention in virtually any appropriately detailed structure. Further, the terms and phrases used herein are not intended to be limiting; but rather, to provide an understandable description of the invention.

Figure 2:
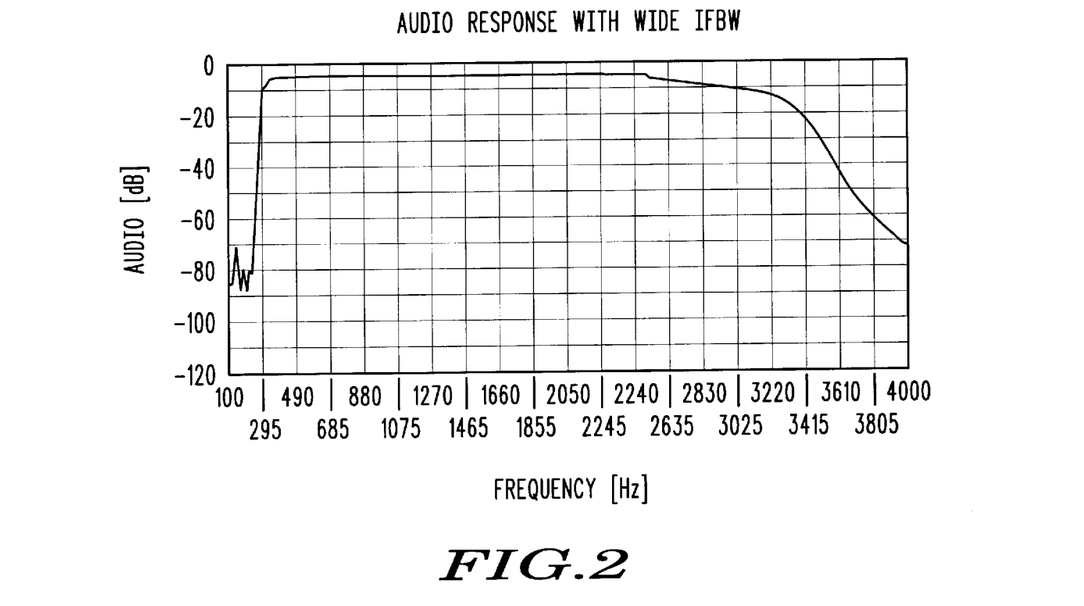

In accordance with the present invention, since receivers do not always operate in an environment where the stringent RF performance is required, the RF characteristics of the receiver are adaptively loosened in order to achieve better audio performance. This RF degradation is achieved by dynamically changing the receiver's bandwidth. If an interferer suddenly appears, the tradeoff between RF and audio is reverted to its original condition. Under the scenario when no interferers are present, the IFBW is opened to the wide state where considerable improvements on the high frequency components the audio spectrum are attained. FIG. 2 illustrates the audio spectrum of a receiver with the wider settings.

Figure 3:
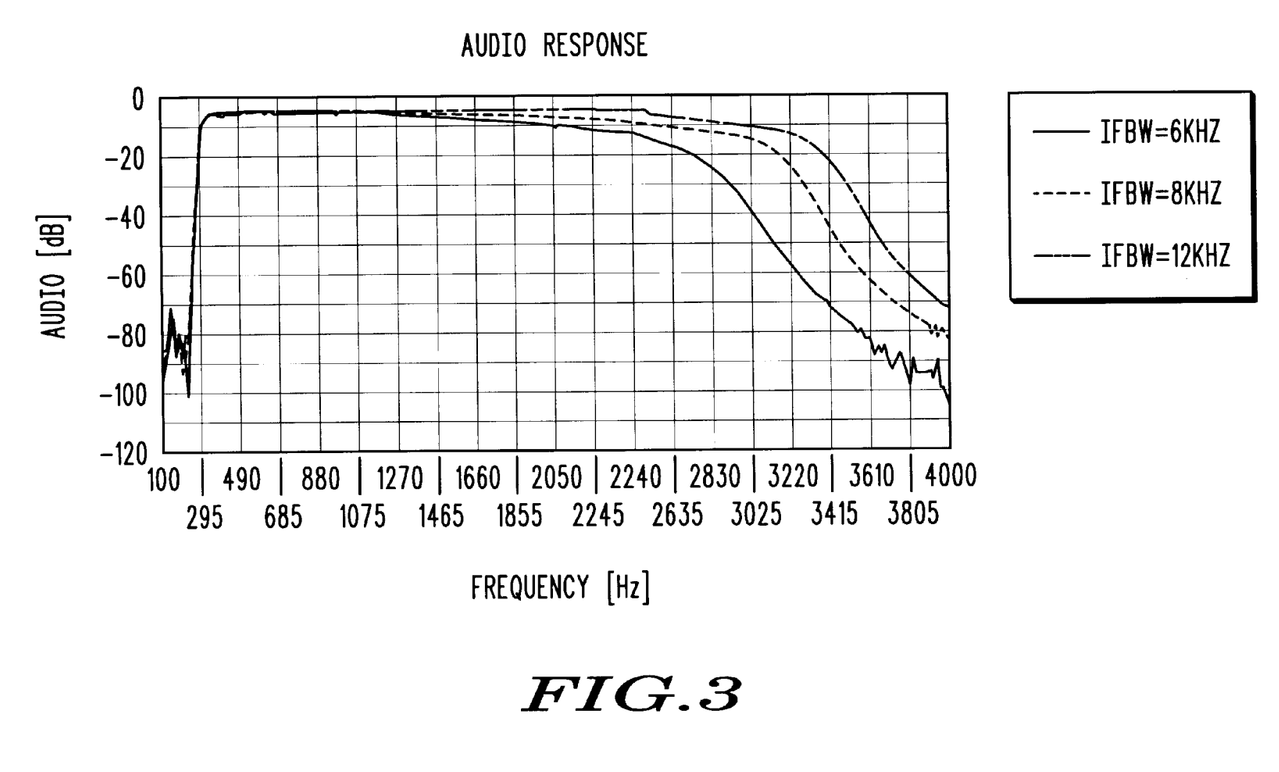

As illustrated in FIG. 2, in the band between 2.5 KHz and 3.5 KHz a considerable improvement is obtained. This is detailed further in FIG. 3, which illustrates the superimposition of FIGS. 1 and 2. This area of the audio spectrum as mentioned earlier directly affects the intelligibility of the recovered audio signal, thus improved and crisper audio is obtained. From FIG. 3 it can be seen that gains of up to 35 dB are attained. This spectral gain in the high end results in a radio, which in a low RF activity area has audio performance comparable to that of a wider channel spacing radio. In a high activity RF area the radio is comparable to any other radio from the audio viewpoint, yet has excellent characteristics from the RF viewpoint.

The present invention provides the widest possible IFBW for the receiver for any given condition. By allowing wider filter bandwidths receiver audio quality can be improved such that performance is comparable to radio communication devices with higher channel spacing.

Figure 4:
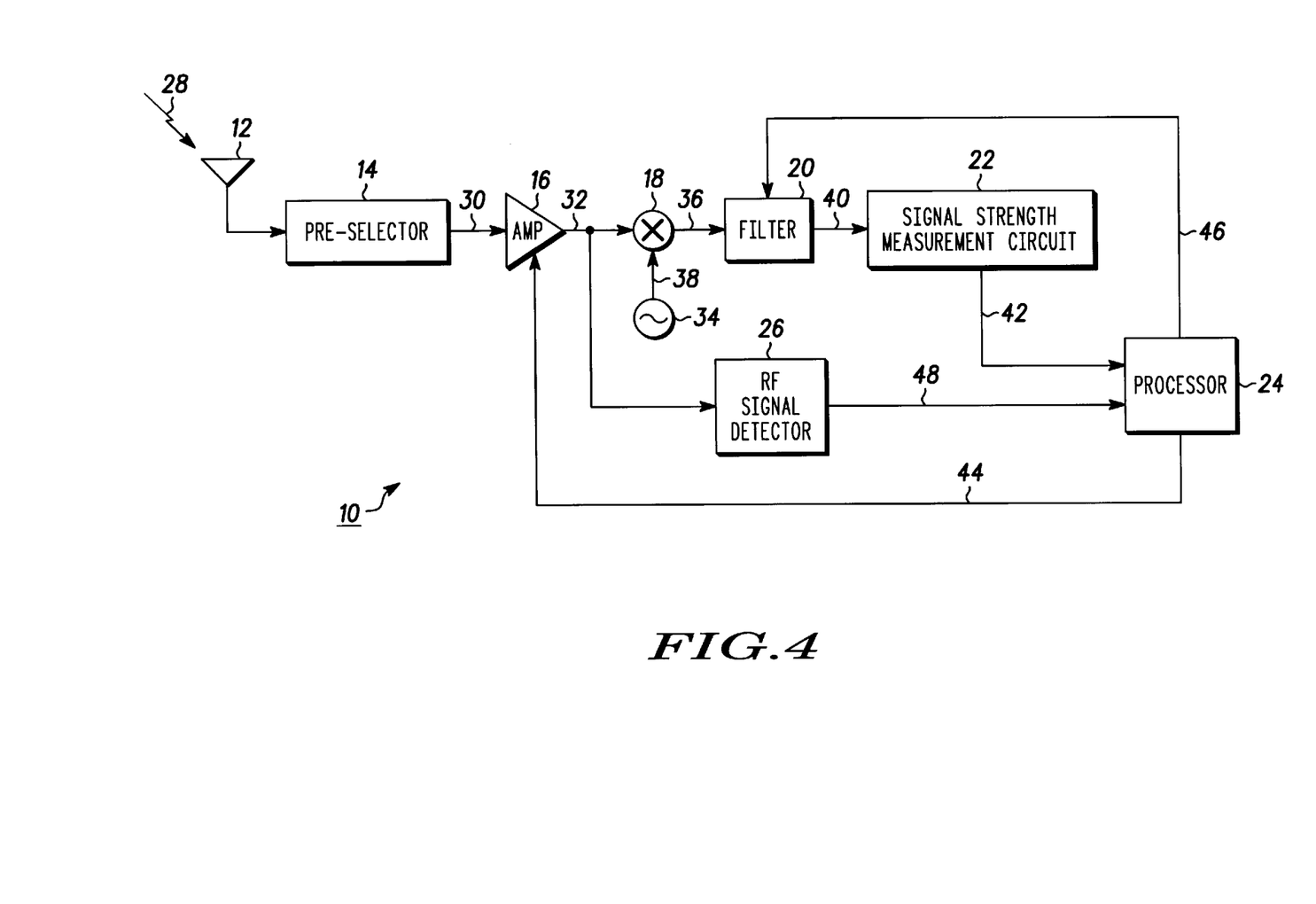
FIG. 4 is a block diagram of a receiver operating in accordance with the present invention.

FIG. 4 illustrates a block diagram of a receiver 10 utilized in radio communication systems and operating in accordance with the present invention. The receiver 10 includes an antenna 12, a preselector 14, an amplifier 16, a mixer 18, a filter 20, a signal strength measurement circuit 22, a processor 24, and a radio frequency (RF) signal detector 26.

The receiver 10 receives a radio frequency (RF) signal 28 sent from a radio communication system that is in a digital format or an analog format using the antenna 12. The preselector 14 is a filter designed to pass RF signals over a range of frequencies (i.e. passband) while suppressing RF signals with frequencies outside of this passband (i.e. stopband). The limits of this passband, along with the frequency response of the antenna 12, dictate which on channel and off channel signals the receiver 10 can respond to. The preselector 14 filters the received RF signal 28 and passes the filtered RF signal 30 to the amplifier 16. The amplifier 16 is an electronic circuit whose purpose is to manipulate the amplitude of signals presented to its input. The amplifier 16 preferably is a variable gain amplifier. The amplifier 16 has a maximum gain, which is defined as its largest output/input amplitude ratio. However, the amplifier 16 is capable of lowering this output/input ratio based on a control line node that is fed from a control block. (For example, as illustrated, an automatic gain control (AGC) command signal 44 from the processor 24.) The amplifier 16 selects the desired portion within the band of frequencies of the filtered RF signal 30, and then amplifies the desired portion, thereby generating an amplified RF signal 32. The mixer 18 preferably is a nonlinear circuit that is designed to combine frequencies from two signals in order to produce a component intermediate frequency (IF) at the difference frequency. In this way, the RF information signal can be shifted to a lower fixed frequency based on the frequency of a local oscillator 34. As illustrated, the mixer 18 is coupled to the output of the amplifier 16 and is also coupled to the output of the local oscillator 34 so as to produce an intermediate frequency (IF) signal 36 from the amplified RF signal 32. The IF signal 36 can be, for example, a very low IF signal or a zero-IF signal. The frequency of the IF signal 36 is the separation in frequency between the amplified RF signal 32 and a local oscillator signal 38. The filter 20 preferably is a programmable filter which allows a first plurality of frequency signals to pass through it, while attenuating a second plurality of frequency signals with frequencies that are above and possibly below some cutoff frequency. The cutoff frequency can be adjusted via a filter command 46 that is fed from the processor 24. The filter 20 generates a filtered IF signal 40 and also removes spurious components of the IF signal 36 to improve the selectivity of the receiver 10 and reduce the adjacent channel interference.

Coupled to the output of the filter 20 is the signal strength measurement circuit 22. The signal strength measurement circuit 22 provides the processor 24 with the amplitude level of signals that are inputs to the signal strength measurement circuit 22. Given the nature of the signal flow through the filter 20, in accordance with the preferred embodiment of the present invention, the output of the signal strength measurement circuit 22 primarily reflects the amplitude of the on channel signal because the cutoff frequency of the filter 20 is at its narrowest when the output of the filter 20 is initially received by the signal strength 30 measurement circuit 22. Preferably, the on channel signal is the reception frequency of the desired signal. The signal strength measurement circuit 22 receives the filtered IF signal 40 from the filter 20 and generates a signal indicator level 42 including the existence and, if present, the strength of the filtered IF signal 40.

Coupled to the output of the signal strength indicator 22 is the processor 24. Preferably, the processor 24 is similar to the MC68328 micro-controller manufactured by Motorola, Inc. of Schaumburg, Ill. It will be appreciated by one of ordinary skill in the art that other similar processors can be utilized for the processor 24, and that additional processors of the same or alternative type can be utilized as required to handle the processing requirements of the processor 24. The processor 24 is the controller that monitors on-channel and off-channel information along with the gain setting of the amplifier 16 and, based on decision thresholds programmed into the processor 24, alters the cutoff frequency of the filter 20 accordingly. The processor 24 preferably is programmed to provide an automatic gain control (AGC) command signal 44 to the amplifier 16 for controlling the gain of the amplifier 16. For example, the processor 24 is programmed to control the gain of the amplifier 16 based on the signal indicator level 42 received from the signal strength measurement circuit 22. Preferably, the processor 24 is programmed with a plurality of RSSI (receiver signal strength indicator) levels. The plurality of RSSI levels, identified as $RSSI_N$, increase in value as the factor "N" increases. For example, $RSSI_1 < RSSI_2 < RSSI_3 < RSSI_4 < RSSI_5 < RSSI_6$. The RSSI levels are paired during operation of the processor 24 to provide hysteresis based on the RF signal strength at the cutoff points. For example, $RSSI_1$ is paired with $RSSI_2$, $RSSI_3$ is paired with $RSSI_4$, and $RSSI_5$ is paired with $RSSI_6$. The processor 24 sends a filter command 46 to the filter 20 based on various algorithms programmed into the processor 24 to compare the signal indicator level 42 with the plurality of RSSI levels. The filter command 46, for example, can be a value for the cutoff frequency of the filter 20.

The RF signal detector 26 provides signal strength information to the processor 24 based on the total contribution of the on channel and the off channel amplitudes. The RF signal detector 26 is coupled to the output of the amplifier 16 for receiving the amplified RF signal 32 and for detecting the off channel signal strength of the amplified RF signal 32. Preferably, the off channel signal strength includes the strength of all signals other than the on channel signal of the amplified RF signal 32. The off channel signal strength 48 is passed from the RF signal detector 26 to the processor 24. The processor 24 preferably also sends the filter command 46 to adjust the cutoff frequency of the filter 20 in response to various values of the off channel signal strength 48.

Figure 5:
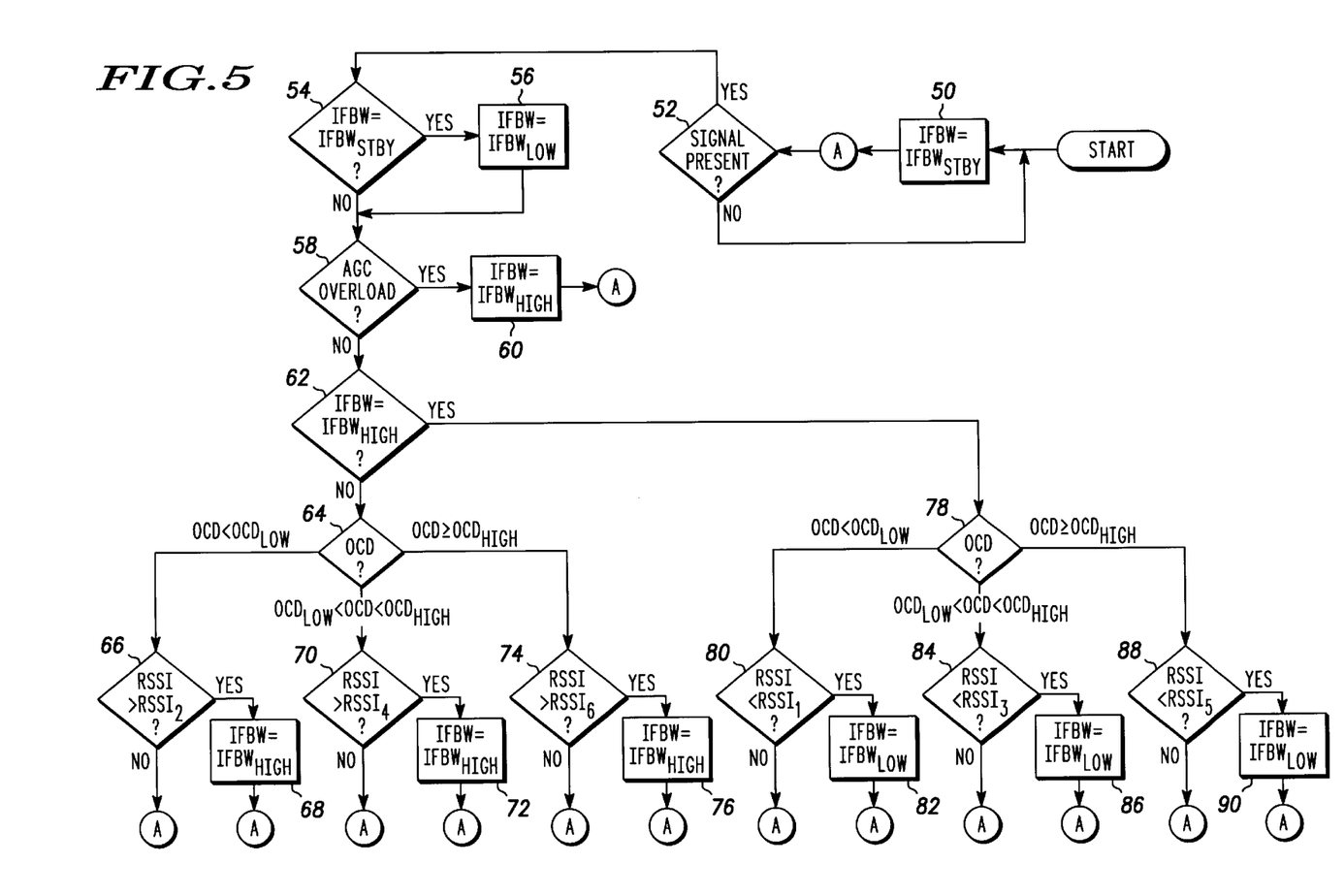
FIG. 5 is a flow chart illustrating the operation of the receiver of FIG. 4 in accordance with the present invention.

FIG. 5 illustrates the operation of the receiver of FIG. 4 in accordance with the preferred embodiment of the present invention. It will be appreciated by one of ordinary skill in the art that the operation of the receiver of FIG. 4 for audio enhancement can be as illustrated in FIG. 5 or an equivalent. The key to this operation is the effect of degrading RF performance to obtain better audio performance in a system where more channels are mandated but yet not necessary in all environments.

In both super heterodyne as well as direct conversion receiver designs, the desired RF signal is down mixed and then (band pass or low pass) filtered prior to demodulation. The filter bandwidth affects the total noise presented to the backend receiver circuits as well as the frequency/distortion response of the demodulated audio. Also, in many cases the automatic gain control decisions are based on the post filtered signal that makes its way to the backend circuitry.

As illustrated in FIG. 5, the process begins with Step 50 in which, prior to receipt of the RF signal 28, the filter 20 is set to a minimal cutoff frequency since audio quality is of no concern while the receiver is in a standby state and is muted. Also, the narrower filter setting reduces the overall noise presented to the system squelch circuitry, thereby resulting in a more sensitive and reliable squelch response. Preferably, the processor 24 sends the filter command 46 to the filter 20 to set an intermediate frequency bandwidth (IFBW) to a standby intermediate frequency bandwidth ($IFBW_{STBY}$). Next, in Step 52, the process determines whether or not a signal is present. Preferably, the signal strength measurement circuit 22 determines the presence of the RF signal 28, and sends the signal indication 42 including whether or not a signal is present to the processor 24. When no signal is present, the process cycles back to Step 50. In Step 54, when a signal is present, (i.e.: an on channel signal reception such as the RF signal 28 is achieved) it is determined whether or not the intermediate frequency bandwidth is set to the standby intermediate frequency bandwidth. (IFBW= $IFBW_{STBY}$) Preferably, the processor 24 compares the IFBW from the signal indication 42 to stored values for IFBW$_{STBY}$. In Step 56, when IFBW=IFBW$_{STBY}$, the cutoff frequency of the filter 20 is widened to some higher bandwidth, a nominal bandwidth (IFBW$_{LOW}$) that will result in reasonable audio quality without sacrificing RF parameters. (e.g. sinad, adjacent channel, etc) under small signal reception. Preferably, the processor 20, in response to a match between IFBW and IFBW$_{STBY}$ sends the filter command 46 to the filter 20 including the IFBW$_{LOW}$ value. Next, and when IFBW≠IFBW$_{STBY}$ in Step 54, in Step 58, the process determines whether the on channel signal is so large that the receiver front end circuits compress and undergo automatic gain control (AGC) overload. Preferably, the processor 24 is programmed to make this determination by comparing the signal indication 42 to preprogrammed AGC overload values. In Step 60, when AGC overload occurs, the filter bandwidth is widened to a maximum bandwidth (IFBW$_{HIGH}$) to optimize audio frequency response and minimize distortion. Preferably, the processor 20, in response to an AGC overload sends the filter command 46 to the filter 20 including the IFBW$_{HIGH}$ value. The process then returns to node B of FIG. 5 and continues to Step 52. When, in Step 58, no AGC overload occurs, the process moves to Step 62 and it is determined whether or not IFBW=IFBW$_{HIGH}$. Preferably, the processor 24 compares the IFBW from the signal indication 42 to stored values for IFBW$_{HIGH}$.

In Step 64, when IFBW≠IFBW$_{HIGH}$, the process checks the off channel signal strength detector (OCD) for the level of any off channel interference. Preferably, the RF signal detector 26 sends the off channel signal strength 48 to the processor 24. The processor 24 compares the level of the off channel signal strength 48 to predetermined thresholds (i.e.: a low threshold (OCD$_{LOW}$) and a high threshold (OCD$_{HIGH}$)). Preferably, the predetermined thresholds are programmed into the processor 24. The off channel signal strength 48 is categorized into one of three windows of signal strength as a first categorizing. Given the off channel signal strength (OCD), the on channel signal strength indicator (RSSI) of the received signal can then be evaluated to determine whether or not the desired incoming signal is large enough to justify the widest filter bandwidth setting, a maximum bandwidth (IFBW$_{HIGH}$). In Step 66, when the OCD<OCD$_{LOW}$, the on channel signal strength indicator (RSSI) is compared to RSSI$_2$. When RSSI>RSSI$_2$, in Step 68, IFBW is set to equal IFBW$_{HIGH}$. Preferably, the processor 20, in response to RSSI>RSSI$_2$, sends the filter command 46 to the filter 20 including the IFBW$_{HIGH}$ value. Next, and when RSSI<RSSI$_2$, in Step 66, the process cycles back to node B of FIG. 5 and continues to Step 52. When, in Step 64, OCD$_{LOW}$<OCD<OCD$_{HIGH}$, the on channel signal strength indicator (RSSI) is compared to RSSI$_4$ in Step 70. When RSSI>RSSI$_4$, in Step 72, IFBW is set to equal IFBW$_{HIGH}$. Preferably, the processor 20, in response to RSSI>RSSI$_4$, sends the filter command 46 to the filter 20 including the IFBW$_{HIGH}$ value. Next, and when RSSI<RSSI$_4$ in Step 70, the process cycles back to node B of FIG. 5 and continues to Step 52. When, in Step 64, OCD≧OCD$_{HIGH}$, the on channel signal strength indicator (RSSI) is compared to RSSI$_6$ in Step 74. When RSSI>RSSI$_6$, in Step 76, IFBW is set to equal IFBW$_{HIGH}$. Preferably, the processor 20, in response to RSSI>RSSI$_6$, sends the filter command 46 to the filter 20 including the IFBW$_{HIGH}$ value. Next, and when RSSI<RSSI$_6$ in Step 70, the process cycles back to node B of FIG. 5 and continues to Step 52.

In Step 78, when IFBW=IFBW$_{HIGH}$ in Step 62, the process checks the off channel signal strength detector (OCD) for the level of any off channel interference. If the filter cutoff frequency is set to the maximum bandwidth (IFBW$_{HIGH}$), then the off channel and on channel levels must be reevaluated during reception to determine if the on channel signal strength indicator (RSSI) has decreased enough to reprogram the filter to a narrower bandwidth, i.e.: a nominal bandwidth (IFBW$_{LOW}$). The operation of the receiver 10 in accordance with the present invention incorporates decision thresholds that provide hysteresis between IFBW$_{HIGH}$ and IFBW$_{LOW}$ states (i.e. the on channel signal strength required to switch the filter to the IFBW$_{HIGH}$ frequency is larger than the on channel signal strength to revert back to IFBW$_{LOW}$ under equivalent off channel interference conditions). Preferably, the RF signal detector 26 sends the off channel signal strength 48 to the processor 24. The processor 24 compares the level of the off channel signal strength 48 to predetermined thresholds (i.e.: OCD$_{LOW}$ and OCD$_{HIGH}$). Preferably, the predetermined thresholds are programmed into the processor 24. The off channel signal strength 48 is categorized into one of three windows of signal strength as a second categorizing. In Step 80, when the OCD<OCD$_{LOW}$, the on channel signal strength indicator (RSSI) of the received signal is compared to RSSI$_1$. When RSSI<RSSI$_1$, in Step 82, IFBW is set to equal IFBW$_{LOW}$. Preferably, the processor 20, in response to RSSI<RSSI$_1$, sends the filter command 46 to the filter 20 including the IFBW$_{LOW}$ value. Next, and when RSSI>RSSI$_1$ in Step 80, the process cycles back to node B of FIG. 5 and continues to Step 52. When, in Step 78, OCD$_{LOW}$<OCD<OCD$_{HIGH}$, the on channel signal strength indicator (RSSI) is compared to RSSI$_3$ in Step 84. When RSSI<RSSI$_3$, in Step 86, IFBW is set to equal IFBW$_{LOW}$. Preferably, the processor 20, in response to RSSI<RSSI$_3$, sends the filter command 46 to the filter 20 including the IFBW$_{LOW}$ value. Next, and when RSSI>RSSI$_3$ in Step 84, the process cycles back to node B of FIG. 5 and continues to Step 52. When, in Step 78, OCD≧OCD$_{HIGH}$, the on channel signal strength indicator (RSSI) is compared to RSSI$_5$ in Step 88. When RSSI<RSSI$_5$, in Step 90, IFBW is set to equal IFBW$_{LOW}$. Preferably, the processor 20, in response to RSSI<RSSI$_3$, sends the filter command 46 to the filter 20 including the IFBW$_{LOW}$ value. Next, and when RSSI>RSSI$_5$ in Step 88, the process cycles back to node B of FIG. 5 and continues to Step 52.

Figure 6:
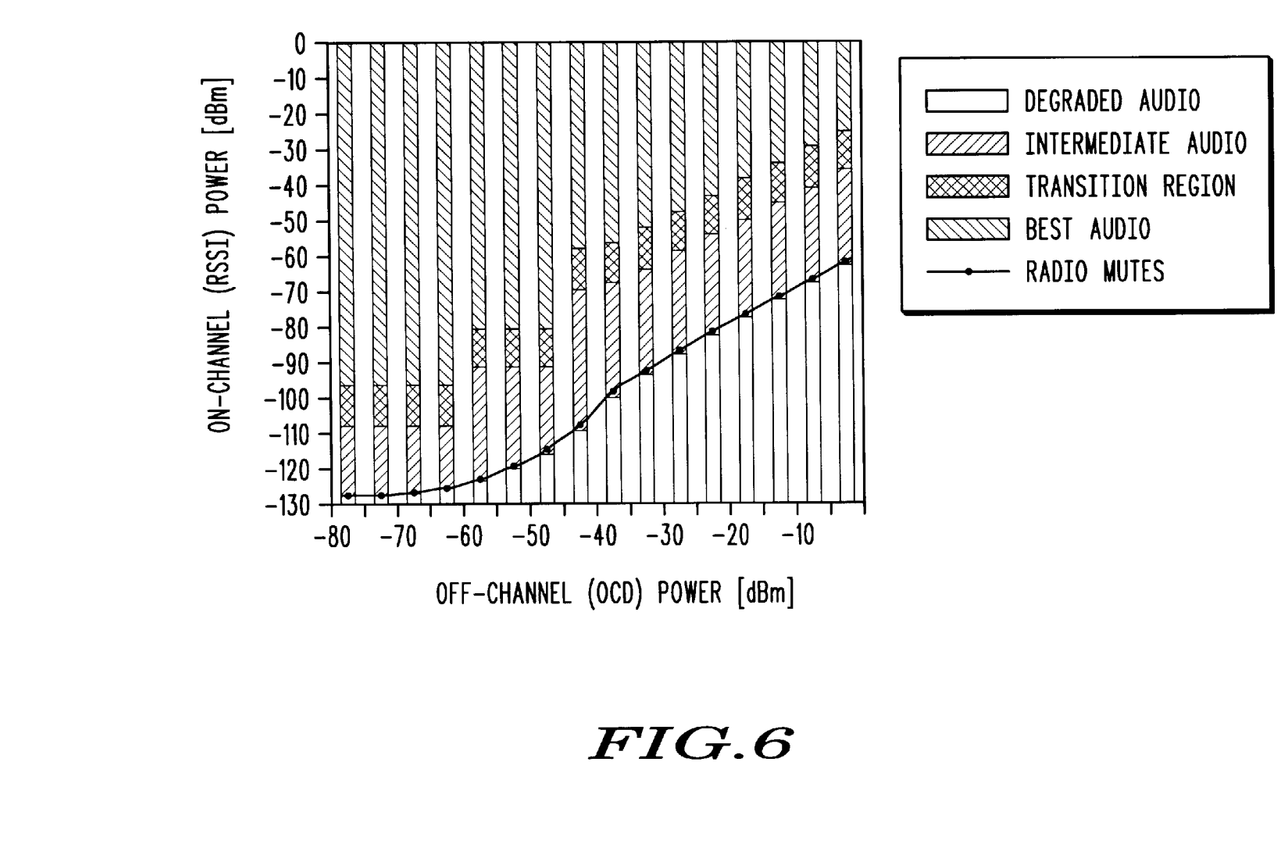
FIG. 6 illustrates audio quality regions as a result of the operation of the receiver of FIG. 4 in accordance with the present invention.

FIG. 6 is a graphical representation of what the operation of FIG. 5 provides under different signal conditions and having three (3) distinct IF-bandwidth states. In FIG. 6, IFBW$_{STBY}$ is set at 6.6 KHz, IFBW$_{LOW}$ is set at 8 KHz and IFBW$_{HIGH}$ is set to 12 KHz. As a direct result of the operation of the receiver 10 in accordance with the present invention, from FIG. 6 one can observe that a radio in a typical RF environment (OCD<−60 dbm) the receiver 10 operates predominantly in the higher IFBW state, which inherently provides better audio performance. In this state, RF characteristics can be overlooked for better audio characteristics. Measurements show that the following improvements are seen in the recovered audio: (a) 2% improvement on receiver distortion, and (b) greater than 10 dB improvement on high frequency audio spectral content (better intelligibility).

Although the invention has been described in terms of preferred embodiments, it will be obvious to those skilled in the art that various alterations and modifications may be made without departing from the invention. Accordingly, it is intended that all such alterations and modifications be considered as within the spirit and scope of the invention as defined by the appended claims.

What is claimed is:

1. A receiver for audio enhancement operating within a radio communication system comprising:
    an antenna for receiving at least one radio frequency signal sent from the radio communication system;
    a preselector coupled to the antenna for filtering the received radio frequency signal, thereby generating a filtered radio frequency signal;
    an amplifier coupled to an output of the preselector for amplifying a desired portion of the filtered radio frequency signal, thereby generating an amplified radio frequency signal;
    a mixer coupled to an output of the amplifier and further coupled to a local oscillator for generating an intermediate frequency signal from the amplified radio frequency signal and a local oscillator signal;
    a filter coupled to the an output of the mixer for generating a filtered intermediate frequency signal by filtering the intermediate frequency signal;
    a signal strength measurement circuit coupled to the an output of the filter for measuring an amplitude level of the filtered intermediate frequency signal and generating a signal indicator level;
    a radio frequency signal detector coupled to an output of the amplifier for detecting an off channel signal strength and an on channel signal strength of the amplified radio frequency signal; and
    a processor, coupled to an output of the radio frequency signal detector and further coupled to the an output of the signal strength measurement circuit, wherein the processor is programmed to:
        receive the signal indicator level,
        generate an automatic gain control command based on the received signal indicator level,
        send the automatic gain control command to the amplifier to control a gain of the amplifier,
        receive the off channel signal strength,
        compare the off channel signal strength to a high threshold and a low threshold stored in the processor,
        categorize the off channel signal strength into a plurality of categories using the results of the comparison of the off channel signal strength to the high threshold and the low threshold,
        receive the on channel signal strength,
        compare the on channel signal strength to one or more pre-programmed values,
        categorize the on channel signal strength into the plurality of categories using the results of the comparison of the on channel signal strength to the one or more pre-programmed values,
        compare an on channel signal strength of at least one of the plurality of categories to an on channel signal strength level associated with the at least one category in response to the categorizing of the off channel signal strength,
        set a cutoff frequency for the filter using the results of the comparing of the on channel signal strength,
        generate a filter command including the cutoff frequency for the filter, and send the filter command to the filter.

2. A receiver as recited in claim 1 wherein the preselector generates the filtered radio frequency signal by passing radio frequency signals over a passband and suppressing radio frequency signals outside of the passband.

3. A receiver as recited in claim 1 wherein the amplifier is a variable gain amplifier.

4. A receiver as recited in claim 1 wherein the mixer is a non-linear circuit for down mixing the filtered radio frequency signal using the local oscillator signal.

5. A receiver as recited in claim 1 wherein the filter is a programmable filter which passes a first plurality of frequency signals above a cutoff frequency and attenuates a second plurality of frequencies below the cutoff frequency, wherein the cutoff frequency is adjusted using the filter command.

6. A receiver as recited in claim 5 wherein the adjusting of the cutoff frequency comprises widening the filter to a higher bandwidth that will result in reasonable audio quality without sacrificing RF parameters.

7. A receiver as recited in claim 1 wherein the signal indicator level is an amplitude of an on channel signal.

8. Within a receiver operating in a radio communication system, a method for audio enhancement comprising the steps of:
    receiving at least one radio frequency signal sent from the radio communication system;
    amplifying a desired portion of the at least one radio frequency signal using a gain, thereby generating an amplified radio frequency signal;
    generating an intermediate frequency signal from the amplified radio frequency signal and a local oscillator signal;
    filtering the intermediate frequency signal using a cutoff frequency, thereby generating a filtered intermediate signal;
    measuring an amplitude level of the filtered intermediate frequency signal;
    determining a gain based on the amplitude level of the filtered intermediate signal;
    sending an automatic gain control command including the gain, wherein the gain is used as the gain in the amplifying step;
    detecting an off channel signal strength of the amplified radio frequency signal;
    comparing the off channel signal strength to at least one of a plurality of threshold levels;
    determining a cutoff frequency value using the results of the comparing step; and
    sending a filter command including the cutoff frequency value, wherein the cutoff frequency value is used as the cutoff frequency in the filtering step.

9. A method for audio enhancement as recited in claim 8 wherein the determining of the cutoff frequency comprises widening the filter to a higher bandwidth that will result in reasonable audio quality without sacrificing RF parameters.

10. A method for audio enhancement as recited in claim 8 further comprising the step of:
    filtering by a preselector the received radio frequency signal before the amplifying step.

11. Within a receiver operating in a radio communication system, a method for audio enhancement comprising the steps of:
    receiving a radio frequency signal having an off channel signal strength and an on channel signal strength;
    comparing the off channel signal strength to a high threshold and a low threshold;
    categorizing the off channel signal strength into a plurality of categories using the results of the comparing of the off channel signal strength step;
    comparing the on channel signal strength to one or more pre-programmed values, categorizing the on channel signal strength in the plurality of categories using the results of the comparing of the on channel signal strength step;

comparing the on channel signal strength of at least one of the categories to an on channel signal strength level associated with the at least one category in response to the categorizing step, wherein the results of the comparing are used to set a filter bandwidth.

12. A method for audio enhancement as recited in claim 11 wherein the one or more pre-programmed values comprise an automatic gain control overload value, the method further comprising the step of:
widening the filter bandwidth to a maximum filter bandwidth when the on channel signal strength is greater than the automatic gain control overload value.

13. A method for audio enhancement as recited in claim 12 further comprising the step of:

comparing the filter bandwidth to the maximum filter bandwidth prior to the comparing of the off channel signal strength, wherein the categorizing of the off channel signal strength step is a first categorizing when the filter bandwidth is the same as the maximum filter bandwidth, and further wherein the categorizing of the off channel signal strength step is a second categorizing when the filter bandwidth is different from the maximum filter bandwidth.

14. A method for audio enhancement as recited in claim 13, wherein the receiver is programmed with a plurality of RSSI (receiver signal strength indicator) levels, wherein the Nth receiver signal strength indicator level is identified as $RSSI_N$, wherein $RSSI_1 < RSSI_2 < RSSI_3 < RSSI_4 < RSSI_5 < RSSI_6$, wherein the categorizing of the off channel signal strength step is the first categorizing, and further wherein the comparing of the on channel signal strength comprises the steps of:

comparing the on channel signal strength to a second received signal strength indicator level when the off channel signal strength is less than the low threshold; and setting the filter bandwidth to the maximum filter bandwidth when the on channel signal strength is greater than the second received signal strength indicator.

15. A method for audio enhancement as recited in claim 14 further comprising the steps of:

comparing the on channel signal strength to a fourth received signal strength indicator level when the off channel signal strength is greater than the low threshold and less than the high threshold, wherein the fourth received signal strength indicator level is greater than the second received signal strength indicator level; and setting the filter bandwidth to the maximum filter bandwidth when the on channel signal strength is greater than the fourth received signal strength indicator.

16. A method for audio enhancement as recited in claim further comprising the steps of:

comparing the on channel signal strength to a sixth received signal strength indicator level when the off channel signal strength is greater than or equal to the high threshold, wherein the sixth received signal strength indicator level is greater than the fourth received signal strength indicator level; and setting the filter bandwidth to the maximum filter bandwidth when the on channel signal strength is greater than the sixth received signal strength indicator level.

17. A method for audio enhancement as recited in claim wherein the receiver is programmed with a plurality of RSSI (receiver signal strength indicator) levels, wherein the Nth receiver signal strength indicator level is identified as $RSSI_N$, wherein $RSSI_1 < RSSI_2 < RSSI_3 < RSSI_4 < RSSI_5 < RSSI_6$, wherein the categorizing is the second categorizing, and further wherein the comparing of the on channel signal strength comprises the steps of:

comparing the on channel signal strength to a first received signal strength indicator level when the off channel signal strength is less than the low threshold; and setting the filter bandwidth to a nominal filter bandwidth when the on channel signal strength is less than the first signal strength indicator level.

18. A method for audio enhancement as recited in claim 17 further comprising the steps of:

comparing the on channel signal strength to a third received signal strength indicator level when the off channel signal strength is greater than the low threshold and less than the high threshold, wherein the third received signal strength indicator level is greater than the first received signal strength indicator level; and setting the filter bandwidth to the nominal filter bandwidth when the on channel signal strength is less than the third received signal strength indicator level.

19. A method for audio enhancement as recited in claim 18 further comprising the steps of:

comparing the on channel signal strength to a fifth received signal strength indicator level when the off channel signal strength is greater than or equal to the high threshold, wherein the fifth received signal strength indicator level is greater than the third received signal strength indicator level; and setting the filter bandwidth to the nominal filter bandwidth when the on channel signal strength is less than the fifth received signal strength indicator level.

* * * * *

UNITED STATES PATENT AND TRADEMARK OFFICE
CERTIFICATE OF CORRECTION

PATENT NO.   : 6,741,844 B2
DATED        : May 25, 2004
INVENTOR(S)  : Medvid, Joseph J. et al.

It is certified that error appears in the above-identified patent and that said Letters Patent is hereby corrected as shown below:

<u>Column 10,</u>
Line 1, after "claim" insert -- 15 --.
Line 13, after "claim" insert -- 13 --.

Signed and Sealed this

Twenty-eighth Day of September, 2004

JON W. DUDAS
*Director of the United States Patent and Trademark Office*